United States Patent
Chiyo et al.

(10) Patent No.: US 7,312,472 B2
(45) Date of Patent: Dec. 25, 2007

(54) COMPOUND SEMICONDUCTOR ELEMENT BASED ON GROUP III ELEMENT NITRIDE

(75) Inventors: Toshiaki Chiyo, Aichi (JP); Jun Ito, Aichi (JP); Naoki Shibata, Aichi (JP)

(73) Assignee: Toyoda Gosei Co., Ltd., Nishikasugai-gun Aichi (JP)

( * ) Notice: Subject to any disclaimer, the term of this patent is extended or adjusted under 35 U.S.C. 154(b) by 0 days.

(21) Appl. No.: 10/466,185

(22) PCT Filed: Jan. 10, 2002

(86) PCT No.: PCT/JP02/00098

§ 371 (c)(1),
(2), (4) Date: Jul. 14, 2003

(87) PCT Pub. No.: WO02/056393

PCT Pub. Date: Jul. 18, 2002

(65) Prior Publication Data

US 2004/0079949 A1    Apr. 29, 2004

(30) Foreign Application Priority Data

Jan. 15, 2001    (JP)    ............................. 2001-007038

(51) Int. Cl.
*H01L 27/15*    (2006.01)
(52) U.S. Cl. .................. 257/79; 257/85; 257/200; 257/615
(58) Field of Classification Search .................. 257/79, 257/85, 200, 615
See application file for complete search history.

(56) References Cited

U.S. PATENT DOCUMENTS

| | | | | |
|---|---|---|---|---|
| 5,874,747 A | * | 2/1999 | Redwing et al. | ............... 257/77 |
| 5,952,681 A | * | 9/1999 | Chen | ............................. 257/89 |
| 6,100,545 A | * | 8/2000 | Chiyo et al. | .................... 257/98 |
| 6,242,764 B1 | * | 6/2001 | Ohba et al. | .................. 257/190 |
| 2002/0036286 A1 | * | 3/2002 | Ho et al. | ........................ 257/11 |
| 2003/0042505 A1 | * | 3/2003 | Ito et al. | ...................... 257/200 |
| 2003/0134447 A1 | * | 7/2003 | Shibata et al. | ................. 438/46 |

FOREIGN PATENT DOCUMENTS

EP    1 039 555 A1    9/2000
JP    9-129921    5/1997

(Continued)

OTHER PUBLICATIONS

International Search Report dated on Jul. 18, 2002.

(Continued)

*Primary Examiner*—Thanh T. Nguyen
(74) *Attorney, Agent, or Firm*—McGinn IP Law Group, PLLC (57) ABSTRACT

In the present invention, $(Ti_{1-x}A_x)N$ [in which A is at least one kind of metal selected from the group consisting of Al, Ga, and In] is used as a metal nitride layer, so that a Group III nitride compound semiconductor layer is formed on the metal nitride layer. When a Ti layer is formed between the metal nitride layer having a sufficient thickness and a substrate and the titanium layer is removed, a Group III nitride compound semiconductor device using metal nitride as a substrate can be obtained.

20 Claims, 5 Drawing Sheets

FOREIGN PATENT DOCUMENTS

| | | | |
|---|---|---|---|
| JP | 9-237938 | | 9/1997 |
| JP | 10-256603 | * | 9/1998 |
| JP | 10-270802 | | 10/1998 |
| JP | 10-321954 | | 12/1998 |
| JP | 2000-31534 | | 1/2000 |
| JP | 2000-49092 | | 2/2000 |
| JP | 2000-077712 | * | 3/2000 |
| JP | 2000-114597 | | 4/2000 |
| JP | 2000-243947 | | 9/2000 |
| JP | 2000-286445 | | 10/2000 |
| JP | 2000-286449 | * | 10/2000 |
| JP | 2000-349267 | | 12/2000 |
| WO | WO 99/28977 | | 6/1999 |
| WO | WO 02/07233 | | 1/2002 |

OTHER PUBLICATIONS

Shiro Shimada, et al., "Preparation (Ti1-xAlx)N films from mixed alkoxide solutions by plasma CVD", *Thin Solid Films*, vol. 370, Mar. 20, 2000, pp. 146-151.

Lim, et al., "Structural analysis of interfacial layers in Ti/Ta/Al ohmic contacts to n-AlGaN", *Journal of Applied Physics*, vol. 88, No. 11, Dec. 1, 2000, pp. 6364-6368.

European Search Report dated Mar. 1, 2007.

Cordes, Holger and Chang, Y.A., "Interfacial Reactions and Electrical Properties of Ti/n-GAN Contacts", MRS Internet Journal of Nitride Semiconductor Research, vol. 2, Article 2.

Ren, Jian Z., et al., "Atomic Structure and phase transitions in disordered Ti1-xGaxN thin films grown by pulsed laser deposition", Journal of Applied Physics vol. 83, No. 12.

Cordes, Holger and Chang, Y.A., "Interfacial Reactions and Electrical Properties of Ti/n-GAN Contacts," MRS Internet Journal of Nitride Semiconductor Research, vol. 2, Article 2, Jan. 22, 1997.

Ren, Jian Z., et al., "Atomic Structure and phase transitions in disordered Ti1-xGaxN thin films grown by pulsed laser deposition", Journal of Applied Physics vol. 83, No. 12, Jun. 15, 1998.

* cited by examiner

ND ON GROUP III ELEMENT NITRIDE

COMPOUND SEMICONDUCTOR ELEMENT BASED ON GROUP III ELEMENT NITRIDE

TECHNICAL FIELD

The present invention relates to a Group III nitride compound semiconductor device.

BACKGROUND ART

Unexamined Japanese Patent Publication No. Hei-09-237938 has disclosed that a (111) face of metal nitride having a sodium chloride structure as an undercoat layer is used as a substrate for obtaining Group III nitride compound semiconductor layers of good crystallinity. That is, in this official gazette, metal nitride having a sodium chloride structure is used as a substrate and Group III nitride compound semiconductor layers are grown on the (111) face of the metal nitride.

Unexamined Japanese Patent Publication No. Hei-10-321954 has also disclosed that an electrically conductive layer of transition-metal nitride and having a sodium chloride or hexagonal structure is interposed between a substrate and a Group III nitride compound semiconductor layer. As examples of the transition-metal nitride, TiN, VN, ZrN, NbN, HfN and TaN have been shown.

The present inventors have made eager examination while paying attention to the metal nitride, particularly TiN. As a result, it has been found that there is fear that difference in lattice constant between TiN and a Group III nitride compound semiconductor may have influence on the crystallinity of the Group III nitride compound semiconductor. Incidentally, the lattice constant of TiN with a face $\underline{c}$ is 0.299 nm whereas the lattice constant of GaN as a Group III nitride compound semiconductor is 0.319 nm.

On the other hand, characteristic (such as stiffness, impact resistance, etc.) for sustaining the function of a semiconductor device is required of a substrate for the semiconductor device. When the substrate is made of metal nitride, it is conceived that the substrate needs to have a thickness of 50 µm or larger in order to sustain the characteristic. Metal nitride having such a thickness has been never provided as a raw material of an industrial product used for producing a semiconductor.

An object of the invention is to bring the lattice constant of metal nitride, which nitride serves as an undercoat layer under a Group III nitride compound semiconductor layer, closer to the lattice constant of the Group III nitride compound semiconductor to thereby improve the crystallinity of the Group III nitride compound semiconductor layer.

Another object of the invention is to make it possible to form a Group III nitride compound semiconductor layer of a good crystallographic structure by using an industrially easily available raw material. Hence, a semiconductor device according to the invention has a semiconductor layer of a good crystallographic structure and can be produced inexpensively.

A further object of the invention is to provide a Group III nitride compound semiconductor device of a novel configuration and a method for producing the same.

DISCLOSURE OF THE INVENTION

The present inventors have made eager examination to achieve at least one of the foregoing objects. As a result, there has been conceived an invention as follows:

A Group III nitride compound semiconductor device having:

a metal nitride layer made of $(Ti_{1-x}A_x)N$ in which A is at least one kind of metal selected from the group consisting of Al, Ga, and In; and a Group III nitride compound semiconductor layer formed on the metal nitride layer.

In the semiconductor device configured as described above according to the invention, a Group III nitride compound semiconductor layer is formed on a metal nitride layer of $(Ti_{1-x}A_x)N$. This metal nitride layer becomes smaller in lattice misfit with the Group III nitride compound semiconductor layer formed on this metal nitride layer than a metal nitride layer of two elements such as TiN. Accordingly, the crystallinity of the Group III nitride compound semiconductor layer can be improved.

The metal nitride layer of $(Ti_{1-x}A_x)N$ can be formed with good crystallinity on a substrate such as sapphire. Moreover, the metal nitride layer can be formed with good crystallinity on a titanium layer because the metal nitride layer contains Ti as a component, while the titanium layer can be formed with good crystallinity on a substrate such as sapphire. Moreover, the metal nitride layer can be made thin because the substrate having a thickness required for sustaining a function of the device can be obtained. Accordingly, the metal nitride layer can be formed easily and inexpensively. When a general-purpose material such as sapphire is used as the substrate, the device can be produced inexpensively as a whole.

BEST MODE FOR CARRYING OUT THE INVENTION

Each of technologies constituting a Group III nitride compound semiconductor device according to the invention will be described below in detail.

First, a hexagonal material such as sapphire, SiC (silicon carbide), GaN (gallium nitride) or $ZrB_2$ (zirconium diboride) or a cubic material such as Si (silicon), GaP (gallium phosphide) or GaAs (gallium arsenide) can be used as a substrate. In the case of a hexagonal material, an undercoat layer is grown on the hexagonal material. In the case of a cubic material, a (111) face of the cubic material is used.

When SiC, GaN, silicon, GaP or GaAs is used as the substrate, electrically conducting characteristics can be given to the substrate. Electrically conducting characteristics can be also given to metal nitride of $(Ti_{1-x}A_x)N$. On this occasion, electrodes can be formed on two surfaces of the semiconductor device. The number of device producing steps can be reduced, so that the cost of production can be reduced. Incidentally, when the composition x of the metal A is selected to be in a range of from 0.01 to 0.6, the metal nitride takes on necessary electrically conducting characteristics. The more preferred composition x of the metal A is 0.1 to 0.6. The especially preferred composition x of the metal A is 0.2 to 0.6.

When an LED is produced with sapphire used as the substrate, improvement of luminance is expected because metal nitride has such a metallic gloss that light emitted from the LED is reflected by titanium nitride, hafnium nitride, zirconium nitride or the like.

Metal nitride further has a function of relaxing distortion (internal stress) caused by difference in lattice constant or thermal expansion coefficient between the sapphire substrate and the Group III nitride compound semiconductor layer because the metal nitride is more flexible than sapphire.

Characteristic (stiffness and impact resistance) for sustaining the function of the device is required of the substrate. Therefore, the thickness of the substrate is selected to be preferably not smaller than 50 µm, more preferably not smaller than 100 µm. The substrate may be however thin if stiffness can be sustained.

At least one kind of Group III element selected from the group consisting of aluminum (Al), gallium (Ga), and indium (In) can be selected as the metal A component contained in the metal nitride of $(Ti_{1-x\ Ax})N$. Particularly, Al is preferred because the difference in lattice constant is small.

The Group III element may be partially replaced by boron (B), thallium (Tl), etc.

A method for growing the metal nitride is not particularly limited. A CVD (Chemical Vapor Deposition) method such as plasma CVD, thermal CVD or optical CVD or a (Physical Vapor Deposition) method such as sputtering, reactive sputtering, laser ablation, ion plating, evaporation or ECR can be used.

When the metal nitride layer is to be formed on a titanium layer, a sputtering method is used especially preferably. This is because the crystallinity of metal nitride single crystal is improved.

In the case of presence of a substrate and/or a titanium layer, the thickness of the metal nitride layer is preferably selected to be in a range of from 5 nm to 10 µm.

When the titanium layer is to be removed to thereby separate the metal nitride layer from the substrate, the thickness of the metal nitride layer is selected to be preferably not smaller than 50 µm, more preferably not smaller than 100 µm because the characteristic of a substrate is required of the metal nitride layer.

When a titanium layer is to be interposed between the metal nitride layer and the substrate, the titanium layer can be formed on the substrate by an evaporation method or a sputtering method. The thickness of the titanium layer is not particularly limited but is selected to be preferably in a range of from 0.1 µm to 10 µm, more preferably in a range of from 0.1 µm to 5 µm, most preferably in a range of from 0.2 µm to 3 µm.

According to the present inventors' examination, it is preferable that an Al layer, when titanium nitride is to be grown on a (111) face of silicon as a substrate, is interposed between the (111) face and the titanium nitride layer. The thickness of the Al layer is not particularly limited but may be selected to be about 100 Å. A method for forming the Al Layer is not particularly limited but the Al layer may be formed, for example, by evaporation ore sputtering.

The titanium layer can be chemically etched with acid (such as hydrofluoric acid). As a result, the substrate is separated from the metal nitride layer. According to the metal nitride layer having electrically conducting characteristics, the metal nitride layer can be used as an electrode, so that only one electrode needs to be formed on the Group III nitride compound semiconductor layer side.

Each Group III nitride compound semiconductor is represented by the general formula $Al_XGa_YIn_{1-X-Y}N$ ($0 \leq X \leq 1$, $0 \leq Y < 1$, $0 \leq X+Y \leq 1$) which includes so-called binary compounds such as AlN, GaN and InN, and so-called ternary compounds such as $Al_xGa_{1-x}N$, $Al_xIn_{1-x}N$ and $Ga_xIn_{1-x}N$ ($0 < x < 1$ in the above). The group III elements maybe partially replaced by boron (B), thallium (Tl), or the like. The nitrogen (N) may be partially replaced by phosphorus (P), arsenic (As), antimony (Sb), bismuth (Bi), or the like. The Group III nitride compound semiconductor layer may contain an optional dopant. Si, Ge, Se, Te, C, or the like, can be used as n-type impurities. Mg, Zn, Be, Ca, Sr, Ba, or the like, can be used as p-type impurities. Incidentally, after doped with p-type impurities, the Group III nitride compound semiconductor may be subjected to electron beam irradiation, plasma irradiation or heating due to a furnace. A method for forming the Group III nitride compound semiconductor layer is not particularly limited. Besides a metal organic chemical vapor deposition method (MOCVD method), the Group III nitride compound semiconductor layer may be formed by a known method such as a molecular beam epitaxy method (MBE method), a halide vapor phase epitaxy method (HVPE method), a sputtering method, an ion-plating method or an electron showering method.

Incidentally, a homo structure, a single hetero structure or a double hetero structure can be used as the structure of the light-emitting device. A quantum well structure (single quantum well structure or multiple quantum well structure) may be used as a layer containing a light-emitting layer.

A buffer layer may be formed between the metal nitride layer and a Group III nitride compound semiconductor layer (second Group III nitride compound semiconductor) constituting the device function portion. The buffer layer is made of a first Group III nitride compound semiconductor. Examples of the first Group III nitride compound semiconductor include: quaternary compound semiconductors represented by $Al_XGa_YIn_{1-X-Y}N$ ($0<X<1$, $0<Y<1$, $0<X+Y<1$); ternary compound semiconductors represented by $Al_XGa_{1-X}N$ ($0<X<1$); and AlN, GaN and InN.

In an MOCVD method, the first Group III nitride compound semiconductor layer (buffer layer) of AlN, GaN, or the like is formed directly on a substrate such as sapphire at a glow temperature of about 400° C. The metal nitride layer can be however obtained as preferable crystal when the first Group III nitride compound semiconductor is grown at a high temperature of about 1000° C. Accordingly, the crystallinity of the second Group III nitride compound semiconductor layer formed on the buffer layer of good crystallinity is also improved.

The temperature of about 1000° C. is substantially equal to the growth temperature of the second Group III nitride compound semiconductor layer (device function-forming layer) formed on the first Group III nitride compound semiconductor layer (buffer layer). Accordingly, the growth temperature, when the first Group III nitride compound semiconductor is formed by the MOCVD method, is selected to be preferably in a range of from 600° C. to 1200° C., more preferably in a range of from 800° C. to 1200° C.

When the growth temperature of the first Group III nitride compound semiconductor layer (buffer layer) is set to be equal to the growth temperature of the second Group III nitride compound semiconductor layer (device function-forming layer) in this manner, temperature adjustment at the time of execution of the MOCVD method can be made easily.

Also when the buffer layer constituted by the first Group III nitride compound semiconductor layer is formed on the metal nitride layer by a sputtering method, the buffer layer can be obtained as a buffer layer with crystallinity equal to or more preferable than that when the buffer layer is formed by the MOCVD method (growth temperature: 1000° C.). Accordingly, the crystallinity of the second Group III nitride compound semiconductor layer formed on the first Group III nitride compound semiconductor layer is also improved. Moreover, when first Group III nitride compound semiconductor layer (buffer layer) is formed by the sputtering method, expensive organic metal such as TMA, TMI, etc. need not be used as raw materials compared with the MOCVD method. Accordingly, the device can be formed inexpensively.

Embodiments of the invention will be described below.

First Embodiment

Figure 1:
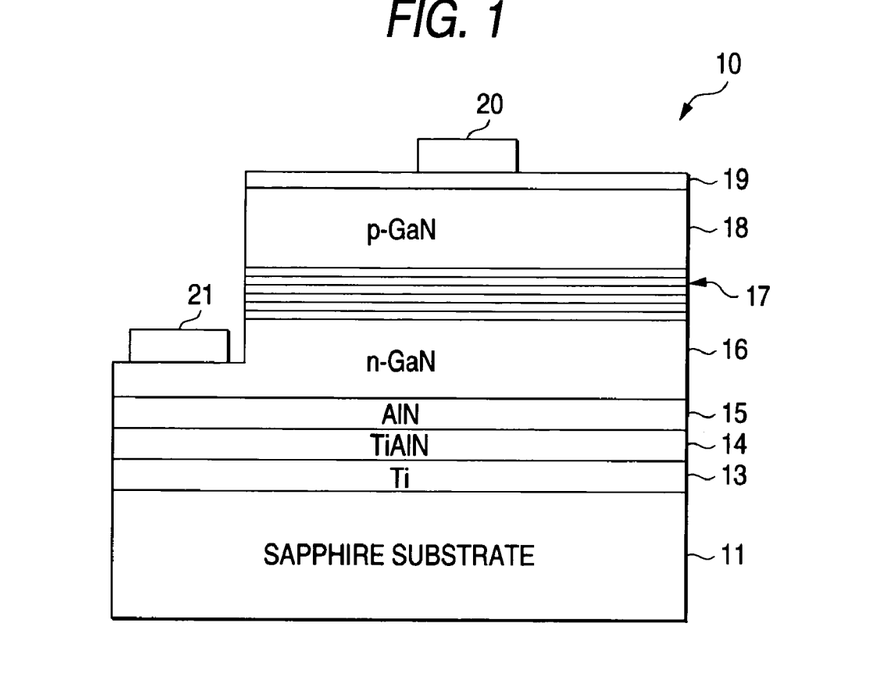
FIG. 1 is a view showing the configuration of a light-emitting diode according to an embodiment of the invention.

This embodiment shows a light-emitting diode 10. FIG. 1 shows the configuration of the light-emitting diode 10.

Specifications of respective layers are as follows.

| Layer | Composition: Dopant |
| --- | --- |
| p-type layer 18 | p-GaN: Mg |
| Layer 17 containing a light-emitting layer | contains a layer of InGaN |
| n-type layer 16 | n-GaN: Si |
| Buffer layer 15 | AlN |
| Metal nitride layer 14 | $Ti_{0.97}Al_{0.03}N$ |
| Ti layer 13 | Ti |
| Substrate 11 | sapphire |

The n-type layer 16 may be of a double-layered structure with an n− layer of a low electron density on the layer 17 containing a light-emitting layer side and an n+ layer of a high electron density on the buffer layer 15 side. The latter is called "n-type contact layer".

The layer 17 containing a light-emitting layer is not limited to a superlattice structure. A single hetero type structure, a double hetero type structure, a homo-junction type structure, or the like, may be used as the structure of the light-emitting device. A single quantum well structure may be also used.

A layer of $Al_XIn_YGa_{1-X-Y}N$ (inclusive of X=0, Y=0 and X=Y=0), which has a wide band gap and which is doped with an acceptor such as magnesium, or the like, may be interposed between the layer 17 containing a light-emitting layer and the p-type layer 18. This is made for preventing electrons injected into the layer 17 containing a light-emitting layer from diffusing into the p-type layer 18.

The p-type layer 18 may be of a double-layered structure with a p− layer of a low hole density on the layer 17 containing a light-emitting layer side and a p+ layer of a high hole density on the electrode side. The latter is called "p-type contact layer".

The Ti layer 13 is formed on a face a of the sapphire substrate by a reactive DC magnetron sputtering method. While nitrogen is circulated, Al is added as a target so that the TiAlN layer 14 is formed on the Ti layer 13 by a reactive DC magnetron sputtering method. Incidentally a TiAl alloy may be also used as the target. The target is further replaced by Al so that the AlN buffer layer 15 is formed by a reactive DC magnetron sputtering method. Incidentally, the formation of the AlN buffer layer 15 may be omitted.

Then, the sample of AlN/TiAlN/Ti/sapphire is transferred from a sputtering apparatus into a chamber of an MOCVD apparatus. While hydrogen gas and ammonia are circulated into the chamber, the sample is heated to 1100° C. and kept for 5 minutes.

Then, while the temperature of 1100° C. is kept, the n-type layer 16 and Group III nitride compound semiconductor layers after the n-type layer 16 are formed by an ordinary method (MOCVD method). In this growth method, an ammonia gas and gases of group III element alkyl compounds such as trimethylgallium (TMG), trimethylaluminum (TMA) and trimethylindium (TMI) are supplied onto a substrate heated to an appropriate temperature and are subjected to a heat decomposition reaction to thereby grow a desired crystal on the substrate.

The group III nitride compound semiconductor layers 16 to 18 formed thus have good crystallinity.

A transparent electrode 19 is constituted by a thin film containing gold. The transparent electrode 19 is laminated so as to cover the substantially whole upper surface of the p-type layer 18. A p-type electrode 20 is also constituted by a material containing gold. The p-type electrode 20 is formed on the transparent electrode 19 by vapor deposition.

An n-type electrode 21 is formed by vapor deposition onto a surface of the n-GaN layer 16 exposed by etching. Incidentally, the AlN buffer layer 15 may be also formed by an MOCVD method.

Second Embodiment

Figure 2:
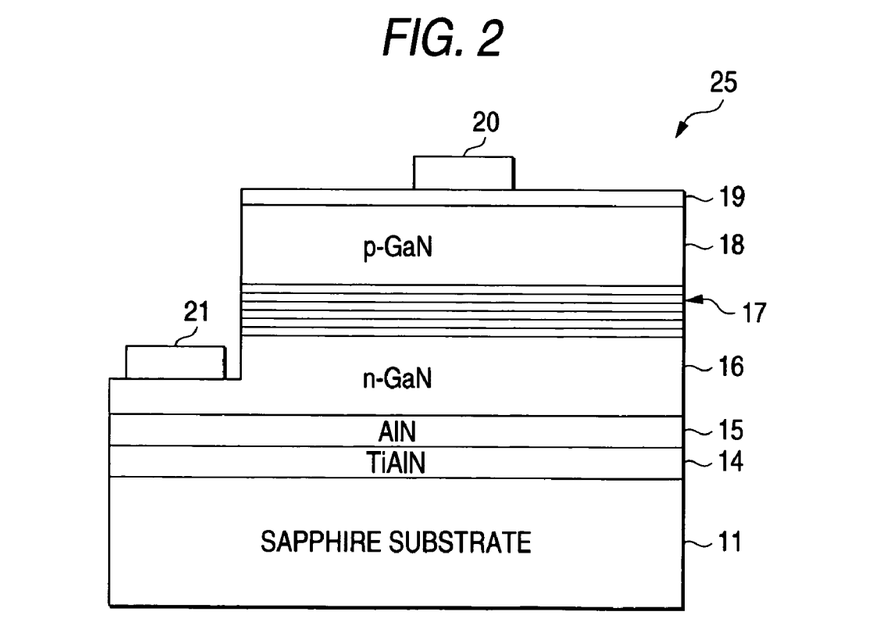
FIG. 2 is a view showing the configuration of a light-emitting diode according to another embodiment of the invention.

FIG. 2 shows a light-emitting diode 25 according to a second embodiment. Incidentally, parts the same as those in the first embodiment are referred to by numerals the same as those in the first embodiment and their description will be omitted. The light-emitting diode 25 according to this embodiment is configured so that the Ti layer 13 is omitted from the light-emitting diode shown in FIG. 1. The metal nitride layer 14 is formed directly on the sapphire substrate.

Also in the light-emitting diode 25 configured as described above, Group III nitride compound semiconductor layers 16 to 18 of excellent crystallinity can be obtained.

Third Embodiment

Figure 3:
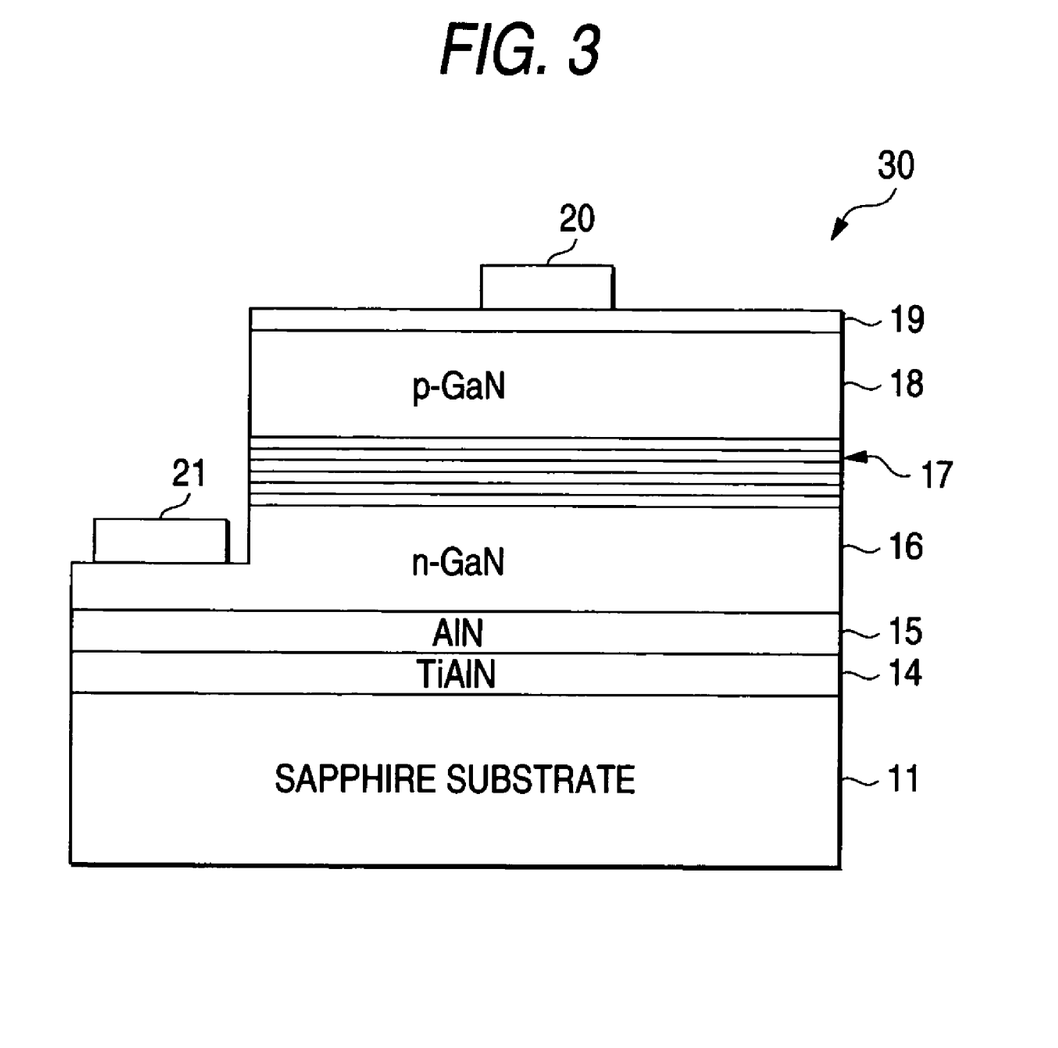
FIG. 3 is a view showing the configuration of a light-emitting diode according to a further embodiment of the invention.

FIG. 3 shows a light-emitting diode 30 according to a third embodiment. Incidentally, parts the same as those in FIG. 2 are referred to by numerals the same as those in FIG. 2, and their description will be omitted. In the light-emitting diode 30 according to this embodiment, a configuration that an n-type electrode 21 is formed on the metal nitride layer 14 is applied to the light-emitting diode shown in FIG. 2. Because the metal nitride layer 14 has electrically conductive characteristic higher than that of the n-GaN layer 16, an electric current can be distributed into the Group III nitride compound semiconductor layers more uniformly as a whole. In addition, because the metal nitride layer 14 of TiAlN contains the same element (Al) as that of then-type electrode 21, contact resistance can be reduced as well as the adhesion between the two can be improved.

Fourth Embodiment

Figure 4:
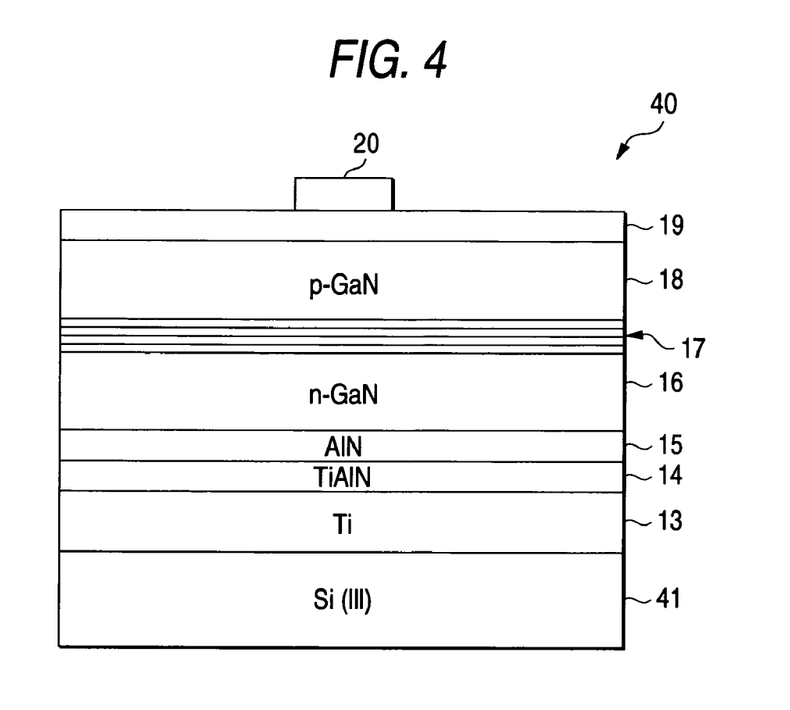
FIG. 4 is a view showing the configuration of a light-emitting diode according to a still further embodiment of the invention.

FIG. 4 shows a light-emitting diode 40 according to a fourth embodiment. Incidentally, parts the same as those in FIG. 1 are referred to by numerals the same as those in FIG. 1 and their description will be omitted.

| Layer | Composition: Dopant |
| --- | --- |
| p-type layer 18 | p-GaN: Mg |
| Layer 17 containing a light-emitting layer | contains a layer of InGaN |
| n-type layer 16 | n-GaN: Si |
| Buffer layer 15 | AlN |
| Metal nitride layer 14 | $Ti_{0.97}Al_{0.03}N$ |
| Ti layer 13 | Ti |
| Substrate 11 | silicon single crystal (111) |

The method of growing the TiN layer 13 et seq. formed on the (111) surface of Si is the same as that in the first embodiment.

Incidentally, the Si substrate layer 41 can be used as an n-type electrode because it has electrically conductive characteristic. Incidentally, the AlN buffer layer 15 may be formed by an MOCVD method or need not be formed by the MOVCD method. Further, an Al layer with a film thickness of 10 nm (100 Å) may be formed between the Si substrate 41 and the Ti layer 13. The Ti layer 13 may be omitted.

Fifth Embodiment

Figure 5:
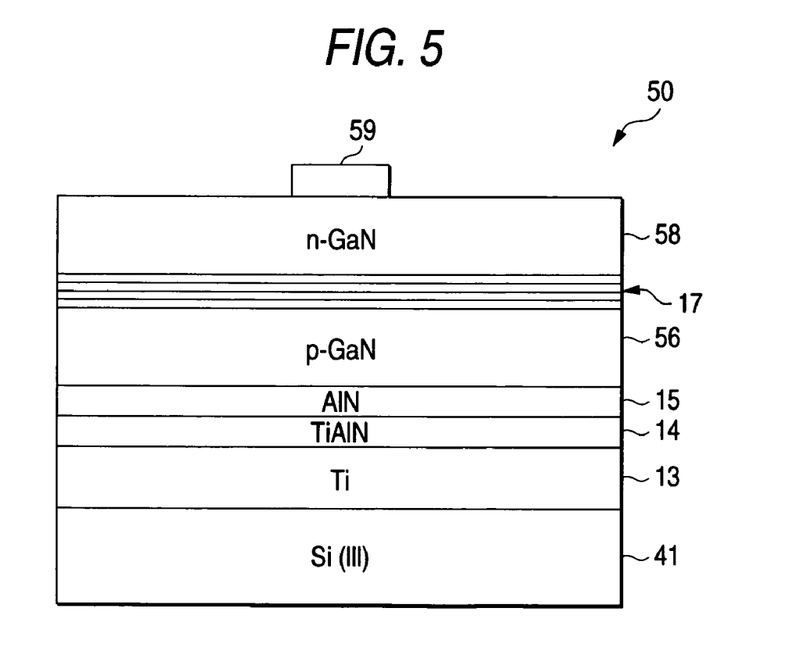
FIG. 5 is a view showing the configuration of a light-emitting diode according to an embodiment of the invention.

FIG. 5 shows a semiconductor device according to a fifth embodiment of the invention. The semiconductor device according to this embodiment is a light-emitting diode 50. Incidentally, parts the same as those in FIG. 4 are referred to by numerals the same as those in FIG. 4 and their description will be omitted.

Specifications of respective layers are as follows.

| Layer | Composition: Dopant |
| --- | --- |
| n-type layer 58 | n-GaN: Si |
| Layer 17 containing a light-emitting layer | contains a layer of InGaN |
| p-type layer 56 | p-GaN: Mg |
| Buffer layer 15 | AlN |
| Metal nitride layer 14 | $Ti_{0.97}Al_{0.03}N$ |
| Ti layer 13 | Ti |
| Substrate 41 | silicon single crystal (111) |

As shown in FIG. 5, the p-type layer 56, the layer 17 containing a light-emitting layer and the n-type layer 58 are grown successively on the buffer layer 15 to thereby form the light-emitting diode 50. In the case of this device 50, the transparent electrode (see the reference numeral 19 in FIG. 4) can be dispensed with because the n-type layer 58 low in resistance value is used as the uppermost layer.

The reference numeral 59 in the drawing designates an n-electrode. The Si substrate 41 can be directly used as a p-electrode.

Incidentally, the AlN buffer layer 15 may be formed by an MOCVD method or need not be formed by the MOVCD method. Further, an Al layer with a film thickness of 10 nm (100 Å) may be formed between the Si substrate and Ti. The Ti layer 13 may be omitted.

Sixth Embodiment

Figure 6A:
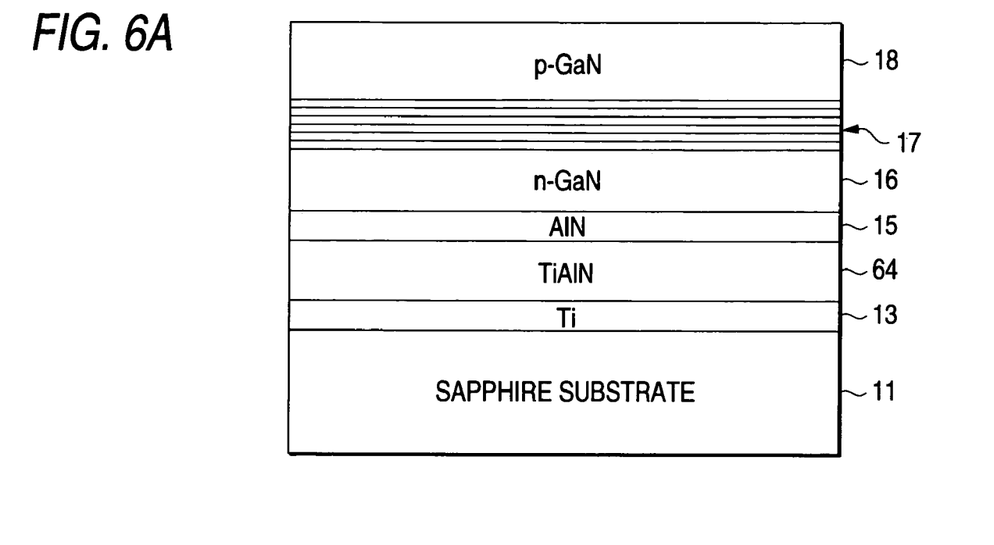
FIGS. 6A-6B are views showing the configuration of a light-emitting diode according to another embodiment of the invention.
Figure 6B:
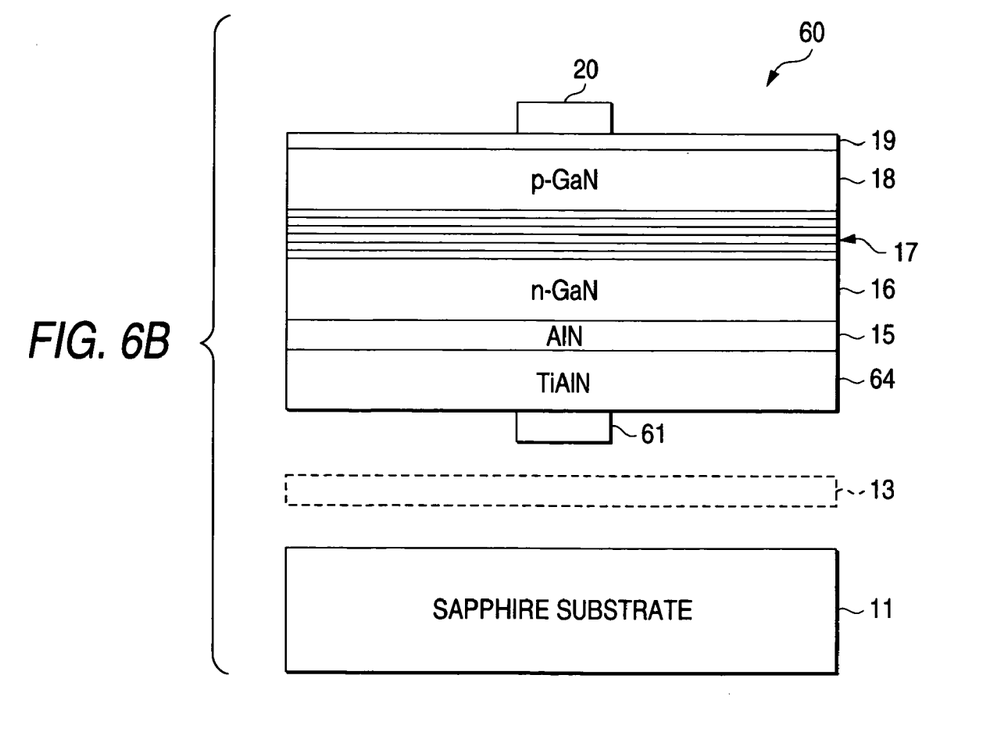

FIG. 6 shows a further embodiment of the invention. Incidentally, parts in FIG. 6 the same as those in the first embodiment are referred to by numerals the same as those in the first embodiment and their description will be omitted. In this embodiment, the film thickness of a TiAlN layer 64 is made 80 μm. Semiconductor layers 15 to 18 are formed on the TiAlN layer 64 by an MOCVD method (see FIG. 6A). Then, the Ti layer 13 is chemically etched with aqua regia to separate the substrate from the TiAlN layer 64 (see FIG. 6B). Electrodes 19, 20 and 61 are formed by vapor deposition in the same manner as in the first embodiment to thereby obtain a light-emitting diode 60 according to this embodiment.

Although this embodiment has shown the case where the Ti layer 13 is removed by etching after the semiconductor layers 15 to 18 are formed, the Ti layer 13 may be removed after the semiconductor layers are partially formed. The Ti layer 13 maybe removed by etching just after the TiAlN layer 64 is formed. That is, a substrate of TiAlN is obtained.

The light-emitting diode 60 obtained thus has a bulk TiAlN substrate as its substrate. Because TiAlN has electrically conductive characteristic, the TiAlN substrate 64 per se may be used as an electrode. In addition, because TiAlN has a metallic gloss, light emitted from the layer containing a light-emitting layer can be efficiently reflected toward the emission observation surface side (the top side in the drawing).

Seventh Embodiment

Figure 7A:
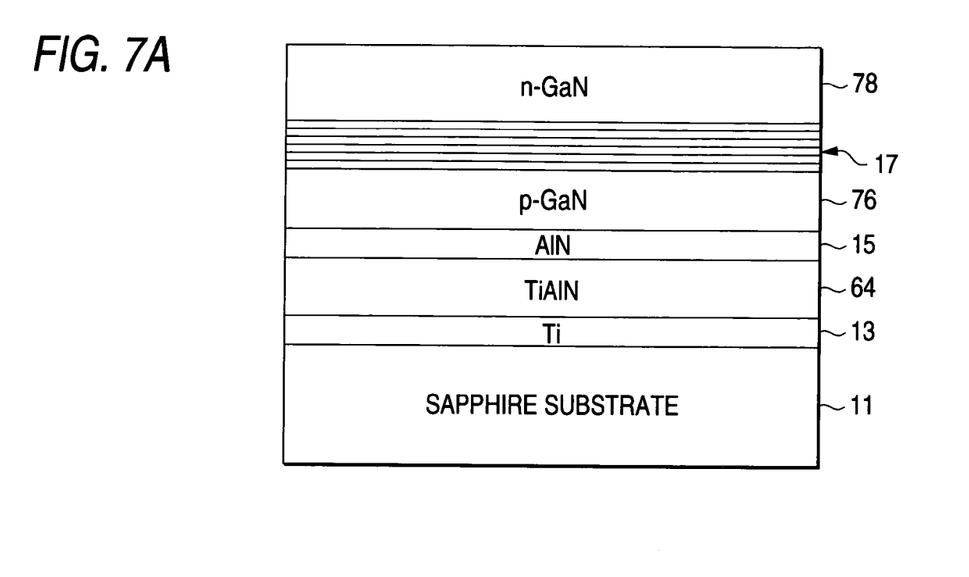
FIGS. 7A-7B are views showing the configuration of a light-emitting diode according to a further embodiment of the invention.

FIG. 7 shows a further embodiment of the invention. Incidentally, parts the same as those in FIG. 6 are referred to by numerals the same as those in FIG. 6 and their description will be omitted. In this embodiment, a p-type layer 76, a layer 17 containing a light-emitting layer and an n-type layer 78 are grown successively on the buffer layer 15 by an MOCVD method. In the case of this embodiment, the transparent electrode (see the reference numeral 19 in FIG. 6) can be dispensed with because the n-type layer 78 low in resistance value is used as the uppermost layer.

Figure 7B:
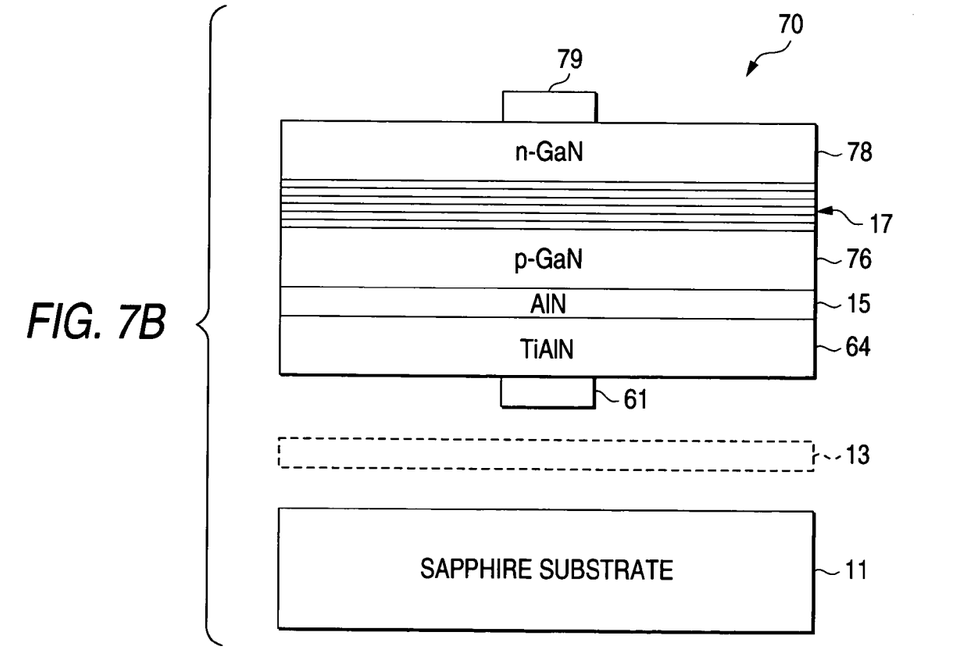

Then, the Ti layer 13 is chemically etched with aqua regia to separate the substrate from the TiAlN layer 64 (see FIG. 7B). An electrode 79 is formed by vapor deposition in the same manner as in the fifth embodiment to thereby obtain a light-emitting diode 70 according to this embodiment.

Although this embodiment has shown the case where the Ti layer 13 is removed by etching after the semiconductor layers 76, 17 and 78 are formed, the Ti layer 13 may be removed after the semiconductor layers are partially formed. The Ti layer 13 may be removed by etching just after the TiAlN layer 64 is formed. That is, a substrate of TiAlN is obtained.

The light-emitting diode 70 obtained thus has a bulk TiAlN substrate as its substrate. Because TiAlN has electrically conductive characteristic, the TiAlN substrate 64 per se may be used as an electrode. In addition, because TiAlN has a metallic gloss, light emitted from the layer containing a light-emitting layer can be efficiently reflected toward the emission observation surface side (the topside in the drawing).

Although the aforementioned embodiment has shown the case where the buffer layer is formed by a DC magnetron sputtering method, it may be formed by an MOCVD method or the like (but the growth temperature is a high temperature of 1000° C.).

INDUSTRIAL APPLICABILITY

The device to which the present invention is applied is not limited to the aforementioned light-emitting diode. For example, the present invention can be applied also to optical devices such as a photodetector, a laser diode, a solar cell, etc.; bipolar devices such as a rectifier, a thyristor, a transistor, etc.; unipolar devices such as an FET, etc.; and electronic devices such as a microwave device, etc.

The present invention may be further applied to laminates which are intermediates of these devices.

The invention is not limited to the description of the mode for carrying out the invention and the embodiments thereof at all, but includes various modifications that can be conceived by those skilled in the art, without departing from the scope of claim for a patent.

Although the present invention has been described in detail and with reference to specific embodiments, it is obvious to those skilled in the art that various changes and modifications may be made without departing from the spirit and scope of the present invention.

This application is based on Japanese Patent Application (Patent Application No. 2001-007038) filed on Jan. 15, 2001, the entirety of which is incorporated herein by reference.

The following items are disclosed below.

Firstly, there is disclosed a Group III nitride compound semiconductor device having: a silicon substrate; a metal nitride layer formed on the silicon substrate and made of $(Ti_{1-x}A_x)N$ in which A is at least one kind of metal selected from the group consisting of Al, Ga, and In; and a Group III nitride compound semiconductor layer formed on the metal nitride layer. Preferably, the metal A is Al and the composition $\underline{x}$ is 0.01 to 0.6. Further, the Group III nitride compound semiconductor device can be used as a light-emitting device or a photodetector.

Secondly, there is disclosed a Group III nitride compound semiconductor device having: a sapphire substrate; a metal nitride layer formed on the sapphire substrate and made of $(Ti_{1-x}A_x)N$ in which A is at least one kind of metal selected from the group consisting of Al, Ga, and In; and a Group III nitride compound semiconductor layer formed on the metal nitride layer. Preferably, the metal A is Al and the composition $\underline{x}$ is 0.01 to 0.6. Further, the Group III nitride compound semiconductor device can be used as a light-emitting device or a photodetector. Further, the metal nitride layer has electrically conductive characteristic, so that an n-electrode can be formed in a portion of the metal nitride layer exposed by etching of the Group III nitride compound semiconductor layers.

Thirdly, there is disclosed a laminate having: a metal nitride layer made of $(Ti_{1-x}A_x)N$ in which A is at least one kind of metal selected from the group consisting of Al, Ga, and In; and a Group III nitride compound semiconductor layer formed on the metal nitride layer. Preferably, the metal A is Al and the composition $\underline{x}$ is 0.01 to 0.6. Further, a Ti layer may be provided between a substrate and the metal nitride layer. Further, the laminate can be used as a light-emitting device or a photodetector.

Fourthly, there is disclosed a method of producing a laminate, having the steps of: forming a titanium layer on a substrate; forming a metal nitride layer on the titanium layer so that the metal nitride layer is made of $(Ti_{1-x}A_x)N$ in which A is at least one kind of metal selected from the group consisting of Al, Ga, and In; and forming a Group III nitride compound semiconductor layer on the metal nitride layer. The method may further have the step of separating the substrate from the metal nitride layer by chemically etching the titanium layer. Preferably, the metal A is Al and the composition $\underline{x}$ is 0.01 to 0.6. Further, the substrate may be preferably selected from the group consisting of sapphire, silicon carbide, gallium nitride, silicon, gallium phosphide, zirconium diboride, and gallium arsenide.

Fifthly, there is disclosed a laminate having: a silicon substrate; a metal nitride layer formed on the silicon substrate and made of $(Ti_{1-x}A_x)N$ in which A is at least one kind of metal selected from the group consisting of Al, Ga, and In; and a Group III nitride compound semiconductor layer formed on the metal nitride layer. Preferably, the metal A is Al and the composition $\underline{x}$ is 0.01 to 0.6. Further, the laminate can be used as a light-emitting device or a photodetector.

Sixthly, there is disclosed a laminate having: a sapphire substrate; a metal nitride layer formed on the sapphire substrate and made of $(Ti_{1-x}A_x)N$ in which A is at least one kind of metal selected from the group consisting of Al, Ga, and In; and a Group III nitride compound semiconductor layer formed on the metal nitride layer. Preferably, the metal A is Al and the composition $\underline{x}$ is 0.01 to 0.6. Further, the laminate can be used as a light-emitting device or a photodetector. Further, the metal nitride layer has electrically conductive characteristic, so that an n-electrode can be formed in a portion of the metal nitride layer exposed by etching of the Group III nitride compound semiconductor layers.

The invention claimed is:

1. A Group III nitride compound semiconductor device comprising:
   a metal nitride layer made of $(Ti_{1-x}A_x)N$, $0.01 \leq x \leq 0.6$, in which A comprises at least one kind of metal selected from the group consisting of Al, Ga, and In;
   a Group III nitride compound semiconductor layer formed on said metal nitride layer; and
   a buffer layer formed between said metal nitride layer and said Group III nitride compound semiconductor layer.

2. A Group III nitride compound semiconductor device according to claim 1, wherein said metal A comprises Al.

3. A Group III nitride compound semiconductor device according to claim 2, wherein said metal nitride layer comprises a thickness of 80 μm, and
   wherein said metal nitride layer forms a bulk substrate of said semiconductor device.

4. A Group III nitride compound semiconductor device according to claim 1, further comprising:
   a substrate; and
   a Ti layer formed between said substrate and said metal nitride layer.

5. A Group III nitride compound semiconductor device according to claim 4, wherein said Ti layer comprises a thickness in a range from 0.1 μm to 10 μm.

6. A Group III nitride compound semiconductor device according to claim 1, wherein said Group III nitride compound semiconductor device comprises one of a light-emitting device and a photodetector.

7. A Group III nitride compound semiconductor device according to claim 1, wherein said composition $_x$ of said metal A comprises a composition from 0.1 to 0.6.

8. A Group III nitride compound semiconductor device according to claim 1, wherein said composition $x$ of said metal A comprises a composition from 0.2 to 0.6.

9. A Group III nitride compound semiconductor device according to claim 1, further comprising:
   a substrate,
   wherein said metal nitride layer is formed directly on said substrate.

10. A Group III nitride compound semiconductor device according to claim 9, wherein said metal nitride layer is formed in direct contact with said substrate.

11. A Group III nitride compound semiconductor device according to claim 1, further comprising an n-type electrode formed directly on said metal nitride layer.

12. A Group III nitride compound semiconductor device according to claim 11, wherein said n-type electrode is formed in direct contact with said metal nitride layer.

13. A Group III nitride compound semiconductor device according to claim 1, wherein said metal nitride Layer comprises $Ti_{0.97}Al_{0.03}N$.

14. A Group III nitride compound semiconductor device according to claim 1, wherein said metal nitride layer comprises an undercoat layer.

15. A Group III nitride compound semiconductor device according to claim 14, wherein said undercoat layer is formed between a substrate and said Group III nitride compound semiconductor layer.

16. A Group III nitride compound semiconductor device according to claim 1, wherein a lattice constant of said metal nitride layer is substantially equal to a lattice constant of said Group III nitride compound semiconductor layer.

17. A Group III nitride compound semiconductor device according to claim 1, wherein said Group III nitride compound semiconductor layer comprises GaN.

18. A Group III nitride compound semiconductor device, comprising:
   a metal nitride layer, said metal comprising titanium and;
   a Group III nitride compound semiconductor layer formed on said metal nitride layer; and
   a buffer layer formed between said metal nitride layer and said Group III nitride compound semiconductor layer.

19. A light emitting diode comprising:
   a Group III nitride compound semiconductor device, comprising:
      a metal nitride layer made of $(Ti_{1-x}A_x)N$, $0.01 \leq x \leq 0.6$ in which A comprises at least one kind of metal selected from the group consisting of Al, Ga, and In;
      a Group III nitride compound semiconductor layer formed on said metal nitride layer; and
      a buffer layer formed between said metal nitride layer and said Group III nitride compound semiconductor layer.

20. A laminate, comprising:
   a metal nitride layer made of $(Ti_{1-x}A_x)N$, $0.01 \leq x \leq 0.6$ in which A comprises at least one kind of metal selected from the group consisting of Al, Ga, and In;
   a Group III nitride compound semiconductor layer formed on said metal nitride layer; and
   a buffer layer fanned between said metal nitride layer and said Group III nitride compound semiconductor layer.

* * * * *